US012601047B2

(12) United States Patent
Chung et al.

(10) Patent No.: US 12,601,047 B2
(45) Date of Patent: Apr. 14, 2026

(54) SUBSTRATE PROCESSING METHOD AND SELECTIVE DEPOSITION METHOD USING THE SAME

(71) Applicants: SK Specialty Co., Ltd., Yeongju-si (KR); Industry-University Cooperation Foundation Hanyang University ERICA Campus, Ansan-si (KR)

(72) Inventors: SungWoong Chung, Sejong-si (KR); Junghun Kawk, Sejong-si (KR); Jihun Lee, Sejong-si (KR); Woohee Kim, Ansan-si (KR); Jeongmin Lee, Ansan-si (KR); Seohyun Lee, Ansan-si (KR)

(73) Assignees: SK SPECIALTY CO., LTD., Yeongju-si (KR); INDUSTRY-UNIVERSITY COOPERATION FOUNDATION HANYANG UNIVERSITY ERICA CAMPUS, Ansan (KR)

( * ) Notice: Subject to any disclaimer, the term of this patent is extended or adjusted under 35 U.S.C. 154(b) by 41 days.

(21) Appl. No.: 18/113,974

(22) Filed: Feb. 24, 2023

(65) Prior Publication Data

US 2023/0323528 A1 Oct. 12, 2023

(30) Foreign Application Priority Data

Mar. 25, 2022 (KR) ........................ 10-2022-0037245
Feb. 15, 2023 (KR) ........................ 10-2023-0019757

(51) Int. Cl.
*C23C 16/04* (2006.01)
*C23C 16/455* (2006.01)

(52) U.S. Cl.
CPC ...... *C23C 16/042* (2013.01); *C23C 16/45525* (2013.01)

(58) Field of Classification Search
CPC ........................ C23C 16/042; C23C 16/45525
See application file for complete search history.

(56) References Cited

U.S. PATENT DOCUMENTS 7,914,847 B2 3/2011 Verghese et al.
2005/0003669 A1* 1/2005 Han .................. H01L 21/31116 257/E21.252
2008/0032064 A1* 2/2008 Gordon ................. C23C 16/402 427/255.4
2019/0164758 A1* 5/2019 Su ....................... H01L 21/3105

FOREIGN PATENT DOCUMENTS

KR 10-2020-0000457 A 1/2020

OTHER PUBLICATIONS

Dufond et al. "Quantifying the Extent of Ligand Incorporation and the Effect on Properties of TiO2 Thin Films Grown by Atomic Layer Deposition Using an Alkoxide or an Alkylamide" Chem. Mater. 2020, 32, 1393-1407. (Year: 2020).*

* cited by examiner

*Primary Examiner* — Robert S Walters, Jr.
(74) *Attorney, Agent, or Firm* — Paratus Law Group, PLLC

(57) ABSTRACT

There is provided a substrate processing method. The method includes providing a substrate having a first surface area and a second surface area having a different surface state than that of the first surface area, exposing the substrate to a substrate surface treatment composition containing a deposition inhibitor, and exposing the substrate to a post-treatment composition containing HF.

17 Claims, 5 Drawing Sheets

SUBSTRATE PROCESSING METHOD AND SELECTIVE DEPOSITION METHOD USING THE SAME

CROSS-REFERENCE TO RELATED APPLICATIONS

This application claims priority to Korean Patent Application Nos. 10-2022-0037245 (filed on Mar. 25, 2022) and 10-2023-0019757 (filed on Feb. 15, 2023), which are all hereby incorporated by reference in their entirety.

BACKGROUND

This invention relates to a substrate processing method and a selective deposition method using the same, and particularly to the substrate processing method using a deposition inhibitor for suppressing deposition of a subsequent thin film and to the method for selectively depositing the thin film on a substrate using the same.

Manufacturing of semiconductor devices is generally carried out by repetitive processes of deposition, photolithography, and etching.

With the downscaling of semiconductor devices, the complexity of manufacturing processes of semiconductor devices is increasing, and the cost of manufacturing semiconductor devices is also increasing. For example, a process such as double patterning is used to form a circuit pattern smaller than the resolution of an exposure apparatus, but the number of manufacturing processes increases accordingly, resulting in the increase of the complexity of manufacturing processes. To solve this problem, a patterning technology using an EUV exposure apparatus is employed, but there is a problem that an increase in manufacturing cost due to the astronomical price of the EUV exposure apparatus is inevitable.

As such, there is a continuous demand for the development of a cost-effective patterning technology while avoiding the complexity of the manufacturing process of semiconductor devices. Area-selective deposition of thin films of semiconductor devices is one of the promising patterning technologies for highly downscaled technological nodes. Area-selective deposition of thin films allows for the omission of costly photolithography processes by selectively depositing a film only on desired surface areas (e.g., conductive surface areas or dielectric surface areas) of a semiconductor device structure.

Area-selective deposition of a thin film has been attempted in various ways.

For example, in Patent Literature 1 (Korean Patent Publication No. 2020-0000457), a surface of a substrate having a conductive surface area (e.g., channel area) and a dielectric surface area is treated with hydrogen plasma so that the conductive surface area becomes hydrogen terminated while the dielectric surface area maintains-OH termination. By exposing the substrate to a reactive gas having deposition selectivity for areas having different surface states (e.g., a reactive gas that is selectively adsorbed and deposited only on hydrogen-terminated surfaces), the thin film can be selectively deposited, for example, only on the conductive surface area.

However, area-selective deposition by plasma surface treatment has a problem that deposition selectivity is not high enough to deposit a film of a desired thickness.

As a method for area-selectively depositing a thin film having a desired thickness, a method using a self-assembled monolayer of a deposition inhibitor is known. The self-assembled monolayer of the deposition inhibitor may increase deposition selectivity between different surface areas by blocking or removing functional groups on the substrate surface that are reactive to precursors for subsequent thin film deposition.

A process utilizing such a self-assembled monolayer of a deposition inhibitor is also used to prevent deposition on an unwanted area in a semiconductor deposition apparatus in addition to selective deposition on different areas of the substrate surface (Patent Literature 2: U.S. Pat. No. 7,914,847). That is, since the deposition of the thin film in the deposition apparatus occurs on the exposed surface other than the desired area of the substrate, thin films are cumulatively deposited on the exposed surface of the reactor of the deposition apparatus while a plurality of substrates are sequentially subjected to deposition processes. The cumulatively deposited films may peel or come off the reactor surface and contaminate the substrate surface. Patent Literature 2 discloses a configuration in which a protective self-assembled monolayer (SAM) is formed on the reactor surface in order to reduce or prevent the amount of unwanted film deposition on the reactor surface.

PRIOR ART LITERATURE

Patent Literature

Patent Literature 1: Korean Patent Publication No. 2020-0000457

Patent Literature 2: U.S. Pat. No. 7,914,847

SUMMARY

The deposition method using the self-assembled monolayer of the deposition inhibitor, in comparison to the area-selective thin-film deposition method by plasma surface treatment, can maintain deposition selectivity between surface areas of different compositions until a film of a sufficient thickness is deposited. However, the increase in the degree of deposition selectivity is not still enough.

In particular, in the process of solution coating or vapor phase adsorption of a deposition inhibitor material for suppressing subsequent thin film deposition on a substrate during an area-selective atomic layer deposition (AS-ALD) process, molecules of the deposition inhibitor compound are adsorbed not only to areas (non-deposited areas) on which a subsequent thin film should not be deposited but also to areas on which a thin film should be deposited, and as a result, there is a problem that selectivity of thin film deposition is not sufficiently obtained.

The objective of the present invention is to provide a substrate processing method capable of further improving deposition selectivity in performing area-selective thin film deposition and an area-selective thin film deposition method using the same.

The substrate processing method according to a first aspect of the present invention comprises steps of:

- providing a substrate having a first surface area and a second surface area having a different surface state than that of the first surface area;
- exposing the substrate to a substrate surface treatment composition containing a deposition inhibitor; and
- exposing the substrate to a post-treatment composition containing HF.

The selective deposition method according to a second aspect of the present invention is a method for area-selectively depositing a thin film on a substrate, and comprises steps of:

processing the substrate by the substrate processing method according to the first aspect of the present invention; and exposing the processed substrate to a deposition reactant gas to selectively deposit the thin film on a first surface area or a second surface area of the substrate.

According to the configuration of the present invention, it is possible to further improve deposition selectivity in performing area-selective thin film deposition.

DETAILED DESCRIPTION

Hereinafter, referring to FIGS. 1A to 1F, the substrate processing method and the deposition method for area-selectively depositing a dielectric film such as a silicon oxide film or a metal oxide film on a dielectric layer relative to a conductive layer or a metal layer will be described.

Specifically, according to an embodiment of the present invention, the substrate processing method and the selective deposition method for selectively depositing a silicon oxide film on a silicon oxide dielectric layer relative to a tungsten (W) metal layer of an underlying substrate are provided. However, the present invention is not limited thereto, and may be applied to area-selective deposition of a hafnium-containing film such as a hafnium oxide film or a ruthenium-containing film such as a ruthenium oxide film, in addition to the area-selective deposition of a silicon oxide film.

Figure 1A:
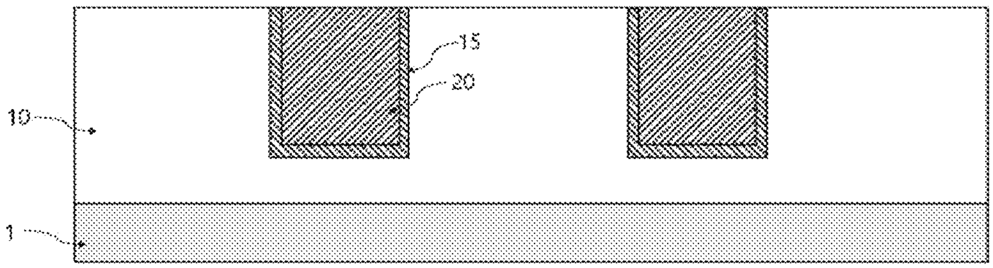
FIGS. 1A to 1F are schematic cross-sectional views illustrating a substrate processing method and a selective deposition method according to an embodiment of the present invention.

As shown in FIG. 1A, a patterned substrate 1 having two or more surface areas of different surface states is provided. For example, the patterned substate 1 includes a dielectric layer 10, a metal layer 20 buried in the dielectric layer 10, and a diffusion barrier layer 15 formed between the dielectric layer 10 and the metal layer 20.

Although FIG. 1A shows the configuration in which the surface area of the metal layer 20 as a first surface area on the substrate and the surface area of the dielectric layer 10 as a second surface area are disposed on the same plane, the present invention is not limited thereto, and the first surface area and the second surface area may be disposed on the different planes. For example, the first surface area or the second surface area may be a bottom/sidewall surface of a trench or groove on the substrate.

The metal layer 20 may contain, for example, copper (Cu), ruthenium (Ru), cobalt (Co), or tungsten (W), and defines the first surface area. The dielectric layer 10 may include, for example, a low-k dielectric material, silicon oxide ($SiO_2$), or a metal-containing dielectric material (a metal oxide, metal nitride, or metal oxynitride), and defines the second surface area. The diffusion barrier layer 15 may include TaN, TiN, TaSiN, or TiSiN.

However, the first surface area and the second surface area of the present invention are not limited thereto and may be a combination of separate areas having different adsorption degrees for a deposition inhibitor as described later. For example, if the metal nitride (SiN) surface area and the metal oxide ($SiO_2$) surface area have different adsorption degrees for the deposition inhibitor, the substrate 1 including the metal nitride surface area and the metal oxide surface area may also be used.

Figure 1B:
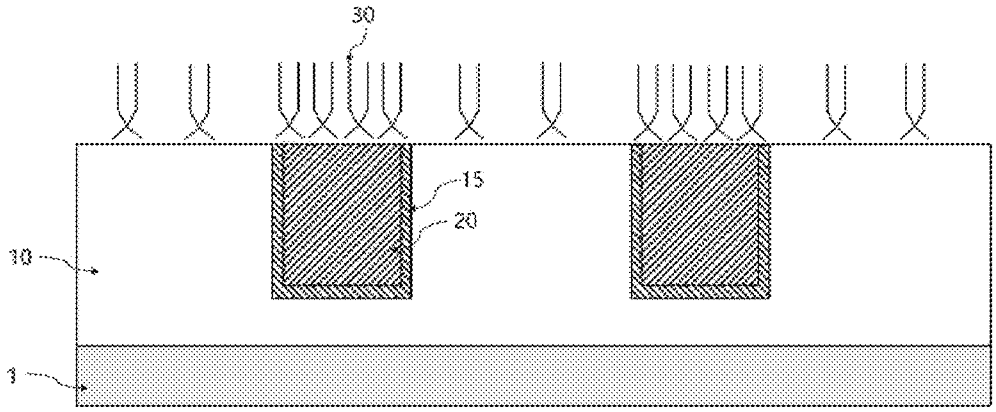

The surface of the substrate 1 is modified by being exposed to the deposition inhibitor capable of forming a self-assembled monolayer, and as a result, as shown in FIG. 1B, molecules of the deposition inhibitor compound are selectively adsorbed on the surface area of the metal layer 20 of the substrate 1 to form the self-assembled monolayer 30.

Figure 2:
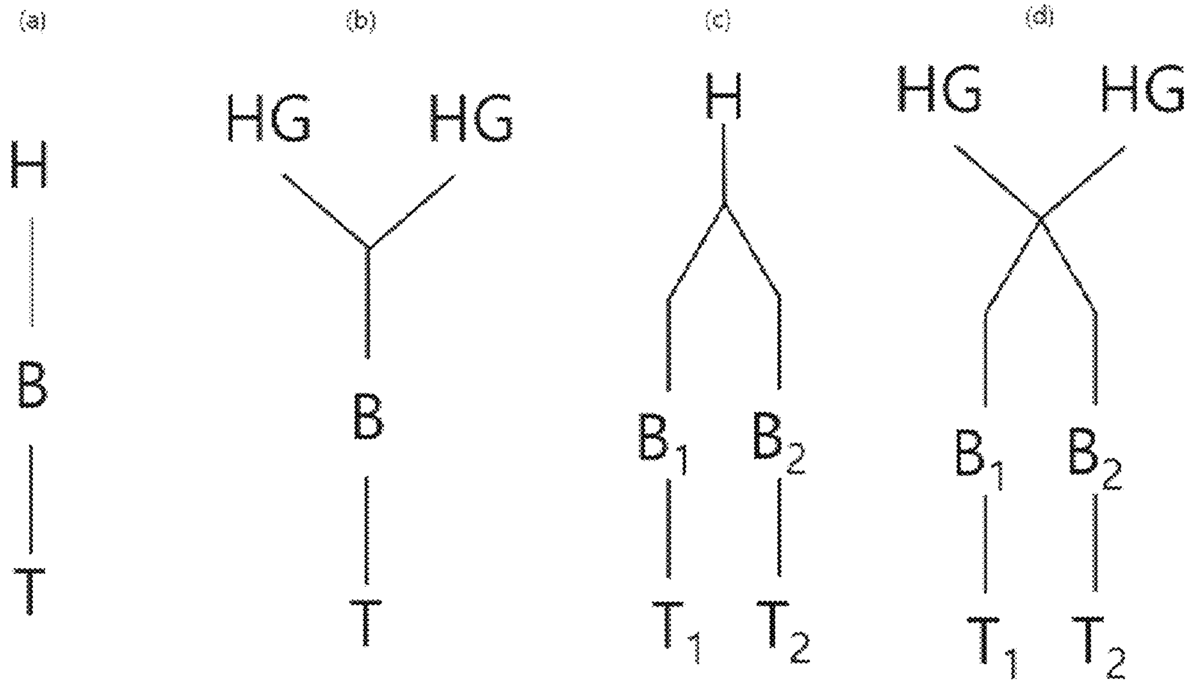
FIG. 2 is a view illustrating a schematic structure of an inhibitor compound used in the substrate processing method according to the embodiment of the present invention.

Referring to FIG. 2, the deposition inhibitor compound for modifying the surface of the substrate having a plurality of surface areas of different surface states will be described in more detail.

The deposition inhibitor compound is used to treat the substrate surface in order to area-selectively deposit the thin film on the substrate having the first surface area and the second surface area having a different surface state than that of the first surface area.

Here, the different surface state means that the degrees of adsorption of molecules of the deposition inhibitor compound to different surface areas of the substrate are different. For example, a film related to the first surface area and a film related to the second surface area may be respectively a conductive/metallic film and a dielectric film, or may be both dielectric films having different compositions (e.g., a metal nitride film and a metal oxide film are both dielectric films, but adsorption degrees of molecules of a substrate surface treatment compound for deposition inhibition to the dielectric films may be different), or may be subjected to the surface treatment etc. to have different surface termination states such as hydrogen termination (H-termination) and hydroxyl termination (OH-termination), or may have different surface states such as hydrophilicity and hydrophobicity. However, the present invention is not limited thereto. The inhibitor compound used in the substrate processing method of the present invention, as shown in FIG. 2, has a molecular structure including a reactive head portion H which can be selectively adsorbed to the first surface area or to the second surface area of the substrate surface (ie, has different absorption degrees to the first surface area and the second surface area), a tale portion T which is non-reactive or inert to deposition reactants of a thin film to be selectively deposited on the substrate, and a body portion B that connects the head portion H and the tail portion T and functions to form a film structure.

A self-assembled monolayer is a three-dimensional structure formed spontaneously on a predetermined substrate surface area by selective adsorption of compound molecules constituting it to the substrate surface area having a predetermined surface state and arranging themselves in a similar direction. Molecules of the deposition inhibitor compound form random molecular aggregates or two-dimensionally arranged phases at the initial stage when the compounds are supplied onto the substrate, but over time, the reactive head portions H of the compound molecules are selectively adsorbed on an area of the substrate surface having the predetermined surface state, and then the body portions B are densely packed in a direction perpendicular to the substrate surface by Van Der Waals force to form a three-dimensional crystalline or semi-crystalline structure on the predetermined surface area of the substrate. Accordingly, the head portion H of the molecule of the deposition inhibitor compound is disposed on the substrate while the tail portion T is disposed remote from the substrate.

Such a self-assembled monolayer prevents deposition reactants (e.g., precursors for ALD) for depositing a thin film from diffusing onto the surface area of the substrate on which the self-assembled monolayer is selectively formed, and inhibits deposition of the thin film by replacing active sites (sites having a reactive functional group which deposition reactants can be absorbed) on the surface area with the tail portions T that are non-reactive or inert to the deposition reactants. In contrast, on the substrate surface area (deposition area) where no self-assembled monolayer is formed, the deposition reactants are freely diffused and adsorbed to active sites on the substrate surface area to form the thin film. As a result, area-selective deposition can be achieved.

The head portion H of the deposition inhibitor compound is a portion enabling selective adsorption to the predetermined surface area of the surface of the underlying substrate, and for this purpose, has a reactive moiety or a functional group (head group) capable of chemically adsorbing to the predetermined surface area of the underlying substrate surface.

For example, the head portion H of the deposition inhibitor compound used in the substrate processing method according to the embodiment of the present invention includes thiol or phosphonic acid as a reactive moiety or head group. Since thiol or phosphonic acid has an acidic property, it tends to absorb to a basic or alkaline underlying surface rather than to an acidic underlying surface. For example, because a dielectric film such as a silicon oxide film has an acidic hydroxyl group on its surface, the head group of thiol or phosphonic acid tends to readily absorb to metal films such as Cu or W, TiN films, and hydrogen-terminated silicon films rather than to a dielectric film such as a silicon oxide film.

As shown in FIG. 2, the head portion H of the molecule of the deposition inhibitor compound may have one or a plurality of head groups (HG).

For example, the head portion H of the molecule of the substrate surface treatment compound used in the substrate processing method according to the embodiment of the present invention may have a single head group such as in the case of octadecylphosphonic acid (ODPA) or perfluorodecylphosphonic acid (PFDPA), and may have two head groups (for example, as in the case of dithiol or bisphosphonic acid).

The head portion H having a plurality of head groups HG can provide a greater adsorption force to the underlying substrate than that of the head portion H having one head group HG and prevents voids where no molecules of the inhibitor compound are absorbed in the self-assembled monolayer from being made. Thereby, the deposition reactant (e.g., ALD precursor) for the subsequent thin film deposition process may be prevented from diffusing through the voids of the self-assembled monolayer to the active sites (sites having reactive functional groups to which the deposition reactant can be adsorbed) of the underlying substrate, and the thin film can be prevented from being deposited on the underlying substrate surface area (no-deposition area) where the thin film is not to be deposited.

Moreover, in comparison with the case in which the head portion H has only one head group HG, thermal stability can be improved because the adsorbed head portions are prevented from being desorbed from the underlying substrate when the substrate is heated during the subsequent thin film deposition process.

Productivity can also be improved by shortening the time required to form the self-assembled monolayer after the treatment composition containing the deposition inhibitor compound is supplied onto the underlying substrate.

Although (b) and (d) of FIG. 2 show a compound molecule whose head portion H has two reactive head groups HG, but the present invention is not limited thereto and may have three or more reactive head groups.

Furthermore, although this embodiment describes, as a reactive head group, thiol or phosphonic acid, the present invention is not limited thereto and may have other reactive head groups.

The tail portion T of the molecule of the deposition inhibitor compound is a portion that functions to provide a non-reactive or inert surface in replace of active sites on the underlying substrate surface. That is, as described above, in the state in which the self-assembled monolayer of the deposition inhibitor compound is formed, the tail portions T of the deposition inhibitor compound molecules are assembled on the remote side from the substrate surface. Because the tail portions T are non-reactive to the deposition reactants (e.g., ALD precursors) of the subsequent deposition process, they prevent the deposition reactants from being adsorbed to the surface area where the self-assembled monolayer is formed and thus, prevent the thin film to be deposited on the surface area.

Examples of the non-reactive moiety of the tail portion T include $—CH_3$ and $—CF_3$, but the present invention is not limited thereto, and any non-reactive group that does not react with the deposition reactant may be used. In particular, since the degree of non-reactivity may vary depending on the composition of the tail portion T and the type of the deposition reactant, it is preferable to determine the composition and chemical structure of the tail portion T so that the non-reactivity can be maximized in accordance with the deposition reactant of the subsequent deposition process.

As shown in FIG. 2, the tail portion T of the molecule of the deposition inhibitor compound may have one or a plurality of non-reactive moieties, but more preferably has a plurality of non-reactive moieties T1 and T2. With this, deposition selectivity between the deposition area and the non-deposited area can be further improved in the subsequent deposition process. That is, since the tail portion T of the deposition inhibitor compound molecule has a plurality of non-reactive moieties, the surface density of the non-reactive moieties can be increased, and the deposition reaction with the deposition reactant in the non-deposited area can be further suppressed.

Although (c) and (d) of FIG. 2 show two non-reactive moieties of the tail portion T, the present invention is not limited thereto, and it may have three or more non-reactive moieties.

Furthermore, when the tail portion T has a plurality of non-reactive moieties, the respective non-reactive moiety may be the same or at least one of them may be different. However, from the viewpoint of ease of synthesis, all the non-reactive moieties in the tail portion T are preferably the same.

The body portion B of the molecule of the deposition inhibitor compound is a portion that connects the head portion H and the tail portion T and is responsible for maintaining a film structure of the self-assembled monolayer. That is, when the head portions H are adsorbed on the predetermined surface area on the underlying substrate, the body portions B arrange themselves in a direction perpendicular to the surface area of the underlying substrate by Van der Waals force between themselves and are densely packed, by which they enable the film structure of the self-assembled monolayer to be maintained.

The capability for the self-assembled monolayer made of the deposition inhibitor compound to block the diffusion of deposition reactants in the subsequent thin film deposition process is greatly influenced by how dense an organic layer of the body portions B can be formed. That is, if the body portions B cannot form a well-aligned organic layer, the deposition reactant easily diffuses into the active sites of the underlying substrate, which causes a decrease in thin film deposition selectivity as well as defect deformation. Whether the body portions B can form a well-aligned (semi-crystalline) dense organic barrier layer or not depends on the structure (multiple chain structure), length (e.g., length of an alkyl chain) and composition/type of the body portion B.

The body portion B of the molecule of the deposition inhibitor compound, as shown in FIG. 2, has one or a plurality of chain structures B1 and B2, and more preferably has a plurality of chain structures B1 and B2. If the body portion B has a plurality of chain structures, the packing density of the body portions B can be relatively increased, and as a result, deposition selectivity between the deposition area and the non-deposited area can be further improved in the subsequent deposition process.

The chain structure B1 and B2 of the body portion B of the deposition inhibitor compound of the present invention may be the same or different, and each independently may be made of a fluorine substituted or unsubstituted C4~C18 alkyl chain or alkylene.

For example, each chain structure of the body portion B may be represented by a chemical formula of $-(CH_2)p(CF_2)q-$, wherein p and q are respectively and independently an integer from 0 to 18, and p+q is preferably from 4 to 18. When the length (p+q) of the alkyl chain constituting the chain structure of the body portion B is less than 4, self-assembling hardly occurs (i.e., the alkyl chain does not stand in a direction perpendicular to the surface area of the underlying substrate but has a structure in which the chain lies down along the substrate surface). When the length of the alkyl chain (p+q) is 19 or more, the alkyl chain may be broken, the molecular weight becomes too large, the vapor pressure becomes too small, and vapor phase formation becomes difficult.

When q is not 0, it is preferable that $-(CH_2)_2-$ is connected to the head portion H and the rest consists of $-(CF_2)m-$ (in this case, the tail portion T is preferably-$CF_3$), or that the entire chain structure of the body portion B is composed of $-(CF_2)q-$ (ie, p=0) (in this case, it is also preferable that the tail portion T is $-CF_3$).

Although (c) and (d) of FIG. 2 illustrate a plurality of chain structures of the body portion B having the same length, but the present invention is not limited thereto, and each chain structure may have a length different from each other.

Furthermore, a plurality of chain structures of the body portion B may have the same composition or may have different compositions. However, from the viewpoint of ease of synthesis of the compound, all the chain structures of the body portion B has preferably the same composition.

The deposition inhibitor compound used in the substrate processing method according to the embodiment of the present invention may be represented by Chemical Formulas 1 to 6.

[Chemical Formula 1]

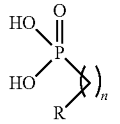

[Chemical Formula 2]

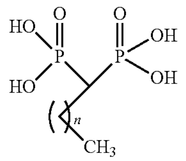

[Chemical Formula 3]

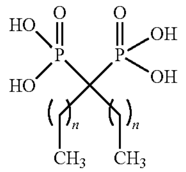

[Chemical Formula 4]

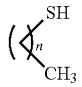

[Chemical Formula 5]

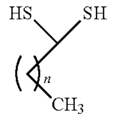

[Chemical Formula 6]

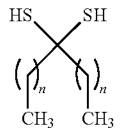

Here, n is an integer from 4 to 18. However, the present invention is not limited thereto, and for example, in Chemical Formula 1 or Chemical Formula 2, the compound may have a structure in which at least one hydrogen of the alkyl chain of the body portion B or $-CH_3$ of the tail portion T is substituted with fluorine (F).

Returning to FIG. 1B, the substrate surface treatment process by the deposition inhibitor will be described in more detail.

The substrate surface treatment process by the deposition inhibitor can be performed as a wet process or a dry process.

In the wet process, the deposition inhibitor compound is dissolved and diluted with water, alcohols (e.g., isopropyl alcohol (IPA), ethanol, methanol) or organic solvents (e.g., dimethyl sulfoxide (DMSO), dimethyl formamide, propylene carbonate (PC), toluene, tetrahydrofuran (THF), etc. to obtain a treatment solution. In particular, in this embodiment, the treatment solution is obtained by dissolving and diluting a phosphonic acid compound such as ODPA or PFDPA with toluene or tetrahydrofuran (THF).

The weight ratio of the deposition inhibitor compound and the solvent is preferably from 1:0 (no dilution) to 1:10000. An acid (e.g., HCl, HF, citric acid) and/or a base (e.g., $NH_4OH$, tetramethylammonium (TMAH)) may be added to adjust the pH value of the treatment solution. The pH value of the treatment solution is preferably from about 6.0 to about 8.0.

In the wet substrate surface treatment process according to an embodiment of the present invention, the substrate 1 shown in FIG. 1A is dipped or immersed in the treatment solution for 18 hours. The temperature of the treatment solution is preferably maintained at from about room temperature (25° C.) to about 120° C.

In the dry process, the deposition inhibitor compound is evaporated or sublimed in a vacuum chamber and supplied to the substrate to be treated. Depending on the vapor pressure and the molecular weight of the deposition inhibitor compound, it can be evaporated after being dispersed in a solvent such as toluene or THF. It is more preferable that the deposition inhibitor compound is evaporated or sublimed by direct heating in order to increase adsorption ratio of the deposition inhibitor compound molecule to the substrate. During the dry process, the temperature in the chamber is preferably maintained at from about room temperature (25° C.) to about 300° C. Also, carrier gases such as $N_2$, Ar, He and/or $H_2$ may be used.

Adsorption degree of the deposition inhibitor compound to the substrate 1 is confirmed by measuring a water contact angle of the substrate 1 whose surface was treated as described above.

The contact angle of the surface area of the metal layer 20 made of tungsten (W) was about 37° before the wet substrate surface treatment process but increased to 140° after the wet treatment with the treatment solution containing the deposition inhibitor compound.

In the meantime, the contact angle of the surface area of the dielectric layer 10 made of a silicon oxide film was increased from about 10° before the wet substrate surface treatment to about 45°. From this, as shown in FIG. 1B, although relatively more of deposition inhibitor compound molecules are adsorbed on the surface area of the tungsten metal layer 20 compared to the surface area of the silicon oxide dielectric layer 10, some adsorption also occurs in the surface area of the silicon oxide dielectric layer 10. This indicates that in the subsequent thin film deposition process, the selectivity of deposition of a metal oxide thin film onto the surface area of the silicon oxide dielectric layer 10 relative to the surface area of the metal layer 20 may not be high enough.

When the substrate surface treatment process is performed by the dry process, the contact angle of the surface area of the metal layer 20 made of tungsten (W) was about 37° before the dry substrate surface treatment process but increased up to 117° after the dry surface treatment process.

In the meantime, the contact angle of the surface area of the dielectric layer 10 made of the silicon oxide film also greatly increased from about 10° before the dry substrate surface treatment to about 94°, which means that in the dry substrate surface treatment compared to the wet substrate surface treatment, more of the deposition inhibitor compound molecules are adsorbed onto the surface area of the silicon oxide dielectric layer 10. This is presumably because the temperature of the dry substrate surface treatment process is higher than that of the wet substrate surface treatment process. Therefore, when the substrate surface treatment process is performed by the dry process, the selectivity of subsequent thin film deposition can be much lower than that of the wet substrate surface treatment process.

Therefore, in the present invention, after the wet or dry substrate surface treatment process with the deposition inhibitor, and before proceeding with the thin film deposition process, a post-treatment for selectively removing the molecules of the deposition inhibitor compound adsorbed on the silicon oxide dielectric layer 10 is carried out.

That is, in the substrate processing method according to the present embodiment, after the wet or dry substrate surface treatment using the deposition inhibitor, the post-treatment step of treating the substrate surface with a post-treatment agent containing HF is performed.

Figure 1C:
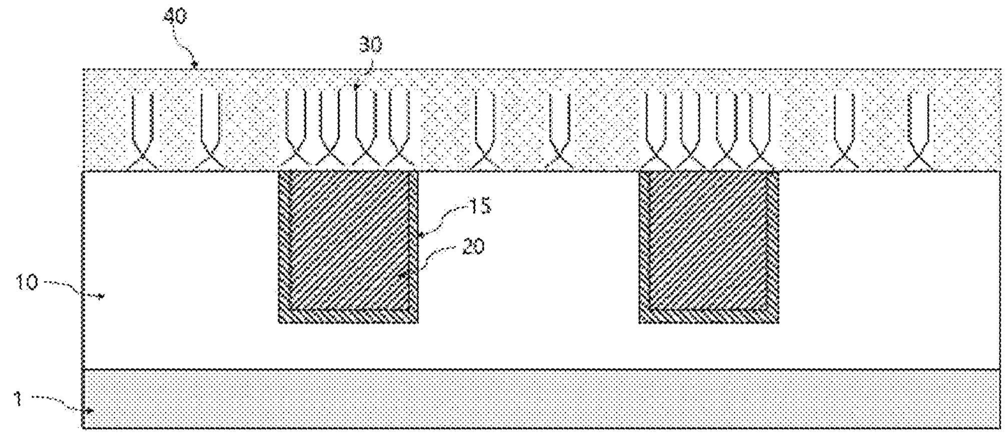

For example, as shown in FIG. 1C, in a state where the deposition inhibitor compound molecules are adsorbed on the surface of the substrate 1 by the dry process, the post-treatment step is performed by dipping or immersing the substrate 1 in a diluted solution containing HF (10% HF solution) (dipping time: 1 second). Table 1 shows changes in contact angles depending on the surface types of the substrate before and after the post-treatment process.

TABLE 1

| | Wafer Type | Contact angle(°) |
|---|---|---|
| right after dry substrate surface treatment process | $SiO_2$ | 94.1 |
| | SiN | 93.9 |
| | TiN | 101.4 |
| | W | 117.6 |
| after HF post-treatment | $SiO_2$ | 19.2 |
| | SiN | 92.3 |
| | TiN | 94.5 |
| | W | 111.6 |

Figure 1D:
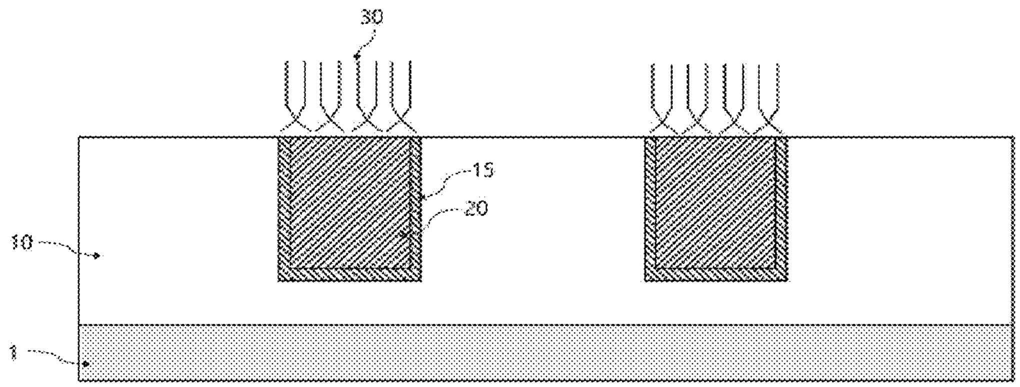

As can be seen from the results of Table 1, the contact angle of the surface area of the silicon oxide dielectric layer 10 film was about 94° immediately after the dry substrate surface treatment process with the treatment composition containing the deposition inhibitor compound, but after the post-treatment process with the HF-containing post-treatment agent, the contact angle of the surface of the silicon oxide dielectric layer 10 is decreased to about 19°. In contrast, the contact angle of the surface of the metal layer made of tungsten (W) is decreased from about 117° before the post-treatment process to about 111°. This means that, as shown in FIG. 1D, molecules of the deposition inhibitor compound adsorbed on the surface of the silicon dioxide dielectric layer 10 are substantially selectively removed.

As described above, after the wet post-treatment process using HF, the deposition inhibitor could be selectively removed from the surface of the silicon oxide dielectric layer 10 compared to the surface area of the tungsten metal layer 20. This is presumed to be because the adsorption density of the deposition inhibitor on the silicon oxide dielectric layer 10 is relatively small compared to the adsorption density of the deposition inhibitor on the tungsten metal layer 20, thereby, the HF-containing post-treatment solution 40 permeates easily to the substrate surface, and furthermore, the silicon oxide film dielectric layer 10 is more easily etched by the post-treatment solution containing HF compared to the tungsten metal layer 20. However, the present invention is not limited to this working principle of the post-treatment process of the present invention.

The degree of selective removal of the deposition inhibitor by the HF-containing post-treatment agent may vary depending on the concentration of the HF-containing post-treatment solution and the post-treatment process time. In the substrate processing method according to the present invention, the concentration of the HF-containing post-treatment solution of the post-treatment process may be from 5% to 15%, may be from 8% to 15%, and more specifically, it may be around 10% or about 10%.

Figure 3:
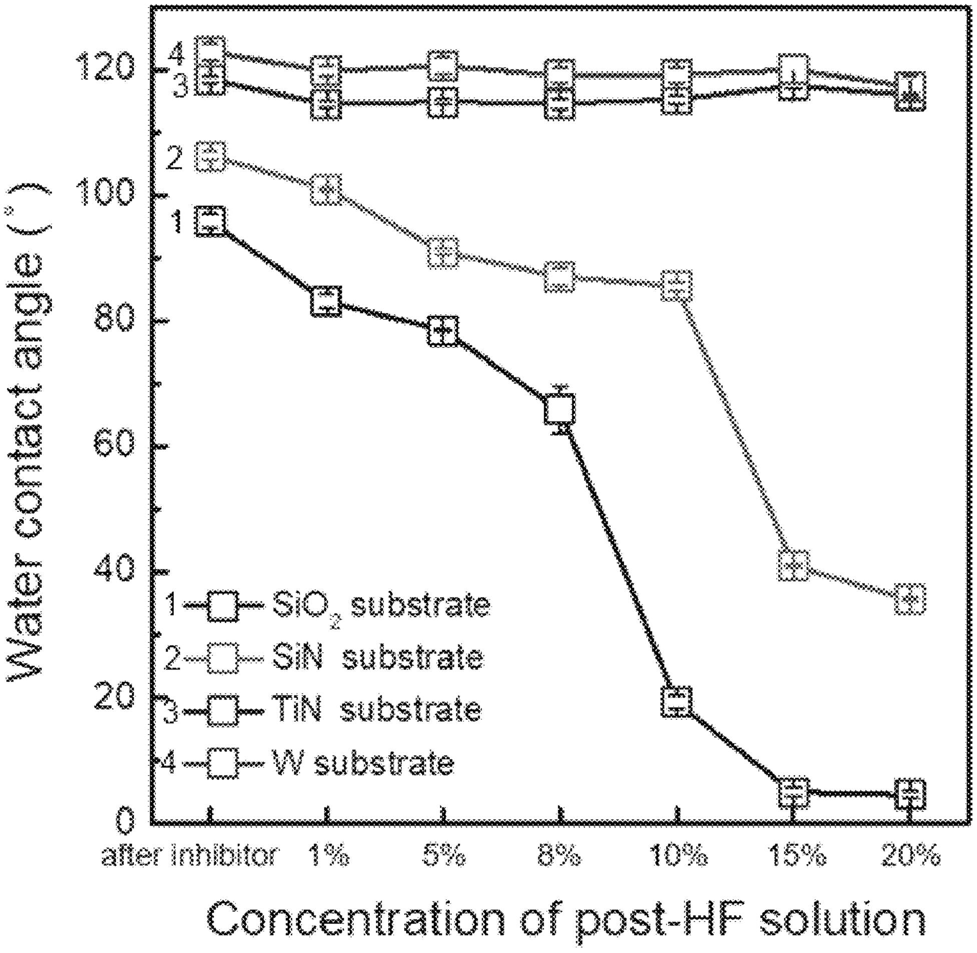
FIG. 3 is a graph of contact angles of substrate surface areas for various concentrations of the post-treatment composition after the post-treatment step of the substrate processing method according to the embodiment of the present invention is carried out.

For example, as shown in FIG. 3, the change in contact angles according to the compositions of the surface areas of the substrate is measured while changing the concentration of the post-treatment solution from 1% HF to 20% HF and fixing the post-treatment process time at 1 second. As a result, in the case of the silicon oxide film surface, as the concentration of the post-treatment solution increases, the contact angle tends to decrease in overall (that is, as the concentration of HF in the post-treatment solution increases, more of the molecules of the deposition inhibitor compound adsorbed on the surface of the silicon oxide film are removed). As the concentration becomes greater than 5% HF, the slope of the contact angle starts to become steep, and as the concentration becomes greater than 8% HF, the slope of the contact angle decreases more steeply (i.e., much more of the molecules of the deposition inhibitor compound adsorbed on the surface of the silicon oxide film are removed).

In contrast, it can be seen that the surface area of the metal layer 20 such as tungsten (W) exhibits a very small change in contact angle compared to the silicon oxide dielectric layer 10 even when the concentration of the HF-containing post-treatment solution increases.

Therefore, by setting the concentration of the HF-containing post-treatment solution to 5% or 8% or more, the deposition selectivity of the thin film between the surface area of the silicon oxide dielectric layer 10 and the surface area of the tungsten metal layer 20 on the substrate can be greatly improved. In contrast, if the concentration of the HF-containing post-treatment solution is less than 5%, the removal of the deposition inhibitor adsorbed on the surface of the silicon oxide film dielectric layer is not sufficient, so that the deposition selectivity relative to the surface of the tungsten metal layer cannot be increased enough.

Meanwhile, when the concentration of the HF-containing post-treatment solution is higher than 15%, the decrease of the contact angle (increase in selectivity) hardly occurs, but the etching degree of the silicon oxide dielectric layer is increased more than necessary, thereby the thickness of the silicon oxide dielectric layer set in semiconductor design may not be maintained.

In addition, the concentration of the diluted solution containing HF used in the post-treatment process may vary depending on the post-treatment process time. For example, as the post-treatment process time becomes longer, the concentration of the HF-containing dilute solution required to remove the same level of deposition inhibitors can be lowered. In contrary, when the post-treatment process time is set shorter, it is desirable to increase the concentration of the HF-containing dilute solution in order to remove the same level of deposition inhibitors.

In this embodiment, the post-treatment process time was set to 1 second, but the present invention is not limited thereto, and it is adjustable within the range of 0.5 seconds to 5 seconds depending on the concentration of the HF-containing diluted solution used in the post-treatment process.

In addition, in the present embodiment, the post-treatment process was performed as a wet process using a dilute solution containing HF, but the present invention is not limited thereto, and a dry or gas-phase post-treatment process using a post-treatment gas containing HF is also possible.

Figure 1E:
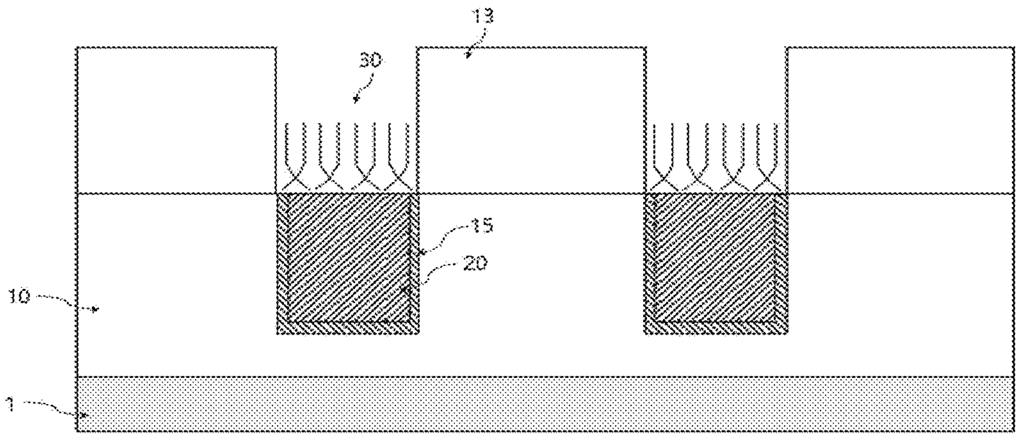

Subsequently to the post-treatment process using HF, as schematically shown in FIG. 1E, metal oxide film 13 is selectively deposited on the dielectric layer 10 relative to the metal layer 20 by exposing the substrate 1 to a deposition gas. The metal oxide film 13 may include $SiO_2$, $HfO_2$, $ZrO_2$, or $Al_2O_3$, and a silicon oxide film is formed as the metal oxide film 13 in this embodiment. The metal oxide film 13 can be deposited by, for example, ALD or plasma enhanced ALD (PEALD), but deposition by ALD is more preferred.

For example, after the post-treatment of the substrate 1 with the diluted HF-containing solution of the present invention, the metal oxide film 13 can be deposited by ALD by alternatively exposing the substrate 1 to a metal-containing precursor (in the case of $SiO_2$, monosilane, higher order silanes such as disilane, NPS (Neopentasilane), alkylsilanes such as 3 MS, halogenated silanes such as MCS, HDCS, amino silanes such as DIPAS, BEMAS, 3DMAS, TSA can be used, among which amino silane is preferably used) and an oxidizing agent (e.g., $H_2O$, $H_2O_2$, plasma excited $O_2$ or $O_3$).

When the substrate surface treatment process by the deposition inhibitor treatment composition and the post-treatment process by the HF-containing post-treatment agent are performed as dry processes, the treatment process and the post-treatment process may be integrated into the metal oxide film deposition process such as an ALD process. For example, after purging a ALD reaction chamber with a purge gas, the substrate surface is subjected to the dry or vapor phase treatment by introducing the treatment composition containing the deposition inhibitor compound in a first pulse (whereby, deposition inhibitor compound molecules are absorbed on the substrate surface). Then in a second pulse, the vapor phase post-treatment agent containing HF is introduced to post-treat the substrate surface, and in a third pulse, the silicon-containing precursor is introduced so that the silicon-containing precursor is absorbed on the surface area of the dielectric layer 10 of the substrate. Then, in a fourth pulse, an oxygen-supplying reactant is supplied to deposit the metal oxide film 13 such as a silicon oxide film selectively on the surface area of the dielectric layer 10 of the substrate by reaction with the silicon-containing precursor. The duration of each pulse is preferably about 1.5 seconds to about 3.0 seconds.

Figure 1F:
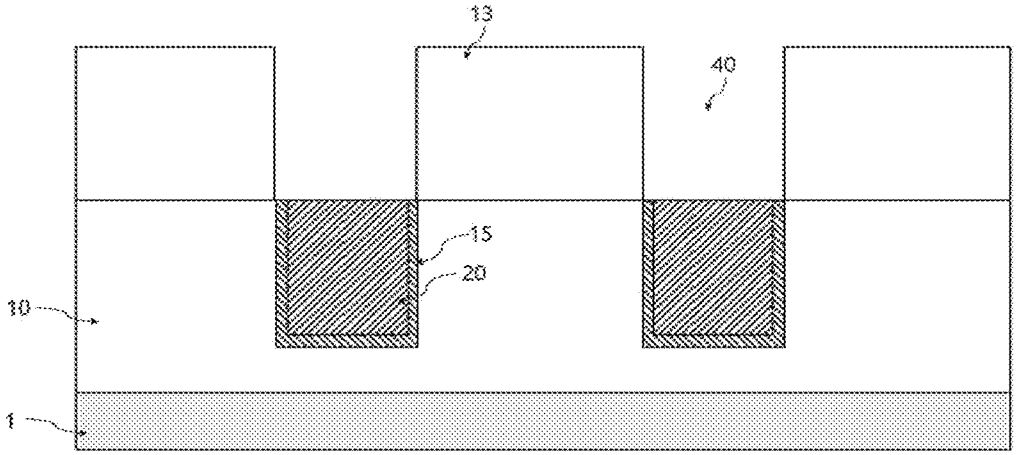

When a predetermined thickness of the metal oxide layer 13 is deposited on the surface area of the dielectric layer 10, as shown in FIG. 1F, the self-assembled monolayer 30 of the deposition inhibitor is removed from the surface area of the metal layer 20 of the substrate 1. The removal of the self-assembled monolayer 30 may be carried out by a wet process or a dry process. As the wet process, ethanol or isopropyl alcohol ultrasonic cleaning can be used. In the dry process, the self-assembled monolayer 30 may be removed by heating the substrate to from about 400° C. to about 600° C. and/or by plasma treatment. In the plasma treatment, exposure to hydrogen gas ($H_2$) excited by a plasma source, exposure to oxygen ($O_2$) excited by a plasma source, or a combination thereof may be used to remove the self-assembled monolayer 30 from the substrate 1.

Through this selective deposition method, as shown in FIG. 1F, the metal oxide film 13 selectively deposited forms self-aligned vias 40 on the metal layer 20. That is, according to the embodiment of the present invention, the self-aligned via 40 may be formed without using a lithography process and an etching process.

The foregoing description of embodiments of the present invention has been presented for purposes of illustration and description. It is not intended to be exhaustive or limited to the examples as precisely disclosed. This disclosure and the claims that follow contain terms used for purposes of explanation only and are not to be construed as limiting. One skilled in the art will recognize that many modifications and variations are possible in light of the above teachings. One skilled in the art will recognize various equivalent combinations and substitutions for the various components shown in the figures. Accordingly, it is intended that the scope of the present invention be limited not by this detailed description, but rather by the claims appended hereto.

DESCRIPTION OF THE SYMBOLS OF THE DRAWINGS

1 substrate
10 dielectric layer (silicon oxide layer)
13 metal oxide film (silicon oxide film)
20 metal layer (tungsten layer)
30 self-assembled monolayers
40 vias

What is claimed is:

1. A substrate processing method comprising steps of:
providing a substrate having a first surface area and a second surface area having a different surface state than that of the first surface area;
exposing the substrate to a substrate surface treatment composition containing a deposition inhibitor; and
after performing the step of exposing the substrate to the substrate surface treatment composition, exposing the substrate to a post-treatment composition containing HF, thereby removing deposition inhibitors adsorbed on any one of the first surface area and the second surface area.

2. The substrate processing method of claim 1, wherein the step of exposing the substrate to the post-treatment composition includes dipping the substrate in a liquid post-treatment composition containing HF.

3. The substrate processing method of claim 2, wherein the liquid post-treatment composition is a diluted HF solution of a concentration from 5% to 15%.

4. The substrate processing method of claim 3, wherein the liquid post-treatment composition is a 10% HF diluted solution.

5. The substrate processing method of claim 1, wherein the step of exposing the substrate to the post-treatment composition includes supplying a vapor phase post-treatment composition containing HF onto the substrate.

6. The substrate processing method of claim 1, wherein the deposition inhibitor has a head portion having different adsorption degrees for the first surface area and the second surface area, a tail portion disposed at an end opposite to the head portion, and a body portion connecting the head portion and the tail portion.

7. The substrate processing method of claim 6, wherein the head portion comprises a thiol or a phosphonic acid.

8. The substrate processing method of claim 6, wherein the head portion has a plurality of head groups.

9. The substrate processing method of claim 6, wherein the body portion has a chain structure composed of C4-C18 alkylene substituted or unsubstituted with fluorine (F).

10. The substrate processing method of claim 9, wherein the body portion has a plurality of the chain structures.

11. The substrate processing method of claim 9, wherein the tail portion has a non-reactive moiety corresponding to the chain structure of the body portion, and the non-reactive moiety is $-CH_3$ or $-CF_3$.

12. The substrate processing method of claim 1, wherein the step of exposing the substrate to the substrate surface treatment composition includes dipping the substrate in a liquid substrate surface treatment composition.

13. The substrate processing method of claim 1, wherein the step of exposing the substrate to the substrate surface treatment composition includes supplying a vaporized substrate surface treatment composition onto the substrate.

14. The substrate processing method of claim 1, wherein the first surface area is a conductive or metallic surface area and the second surface area is a dielectric surface area.

15. A method for area-selectively depositing a thin film on a substrate, comprising steps of:
processing the substrate by the substrate processing method according to claim 1; and
exposing the processed substrate to a deposition reactant gas to selectively deposit the thin film on a first surface area or a second surface area of the substrate.

16. The method of claim 15, wherein the first surface area is a conductive or metallic surface area and the second surface area is a dielectric surface area, and
the thin film including a silicon-containing film, a hafnium-containing film, or a ruthenium-containing film is selectively deposited on the second surface area.

17. The method of claim 15, wherein the thin film is deposited by an ALD or CVD method.

* * * * *